US009207080B2

(12) United States Patent
Ragot

(10) Patent No.: US 9,207,080 B2
(45) Date of Patent: Dec. 8, 2015

(54) METHOD AND DEVICE FOR ANGULAR MEASUREMENT WITH COMPENSATION OF NON-LINEARITIES

(75) Inventor: Vincent Ragot, Paris (FR)

(73) Assignee: SAGEM DEFENSE SECURITE, Paris (FR)

( * ) Notice: Subject to any disclaimer, the term of this patent is extended or adjusted under 35 U.S.C. 154(b) by 233 days.

(21) Appl. No.: 13/581,790

(22) PCT Filed: Mar. 23, 2011

(86) PCT No.: PCT/EP2011/001438
§ 371 (c)(1),
(2), (4) Date: Aug. 29, 2012

(87) PCT Pub. No.: WO2011/116945
PCT Pub. Date: Sep. 29, 2011

(65) Prior Publication Data
US 2012/0324999 A1  Dec. 27, 2012

(30) Foreign Application Priority Data

Mar. 23, 2010 (FR) ..................................... 10 01159

(51) Int. Cl.
*G01C 19/00* (2013.01)
*G01C 19/56* (2012.01)
*H03M 1/10* (2006.01)
*H03M 1/12* (2006.01)

(52) U.S. Cl.
CPC ............. *G01C 19/56* (2013.01); *H03M 1/1038* (2013.01); *H03M 1/1085* (2013.01); *H03M 1/12* (2013.01)

(58) Field of Classification Search
CPC .. G01C 19/56; H03M 1/1038; H03M 1/1085; H03M 1/12

USPC .......................... 73/1.75, 504.02, 510, 504.12
See application file for complete search history.

(56) References Cited

U.S. PATENT DOCUMENTS

| 4,157,041 A | * | 6/1979 | Loper et al. ................. 73/504.13 |
| 4,951,508 A | * | 8/1990 | Loper et al. ................. 73/504.13 |
| 5,587,529 A | * | 12/1996 | Iguchi et al. ............... 73/504.13 |

(Continued)

FOREIGN PATENT DOCUMENTS

EP  1 541 967 A1  6/2005

OTHER PUBLICATIONS

"Practical Issues in Frequency Disturbance Recorder Design for Wide-Area Monitoring," Chunchun Xu, Zhian Zhong, Virgilio Centeno, Richard Conners and Yilu Liu, Electrical Power Quality and Utilisation, Journal, vol. XI, No. 1, Virginia Politechnic Institute and State University, USA, 2005.*

*Primary Examiner* — Laura Martin
*Assistant Examiner* — Samir M Shah
(74) *Attorney, Agent, or Firm* — Muncy, Geissler, Olds & Lowe, P.C.

(57) ABSTRACT

Method of angular measurement by a resonator associated with a vibration setting device and with a vibration detector, which are linked to a processing circuit through which there travel control signals and measurement signals, the method comprising the steps of digitizing the measurement signals and of deducing an angular measurement from the measurement signals. The method comprises the steps of performing a spectral analysis of the digitized measurement signals so as to detect harmonic distortions therein and correcting at least some of the signals travelling through the processing circuit so as to attenuate the non-linearities.

15 Claims, 1 Drawing Sheet

(56) References Cited

U.S. PATENT DOCUMENTS

Figure 1:
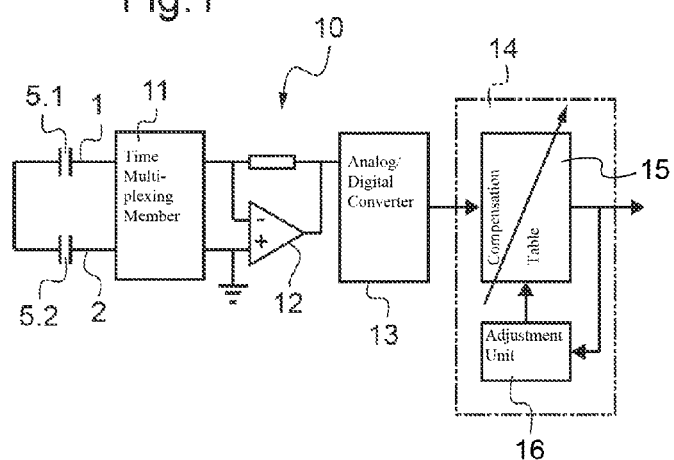

| | | | |
|---|---|---|---|
| 5,712,427 A * | 1/1998 | Matthews | 73/504.04 |
| 5,763,780 A * | 6/1998 | Matthews et al. | 73/504.13 |
| 5,817,940 A * | 10/1998 | Kobayashi et al. | 73/504.12 |
| 5,892,152 A * | 4/1999 | Darling et al. | 73/504.13 |
| 5,915,276 A * | 6/1999 | Fell | 73/504.13 |
| 5,983,719 A * | 11/1999 | Matthews et al. | 73/504.13 |
| 6,065,340 A * | 5/2000 | Matthews et al. | 73/504.13 |
| 6,189,382 B1 * | 2/2001 | Johnson | 73/504.13 |
| 6,401,534 B1 * | 6/2002 | Fell et al. | 73/504.13 |
| 6,927,568 B2 * | 8/2005 | Nozoe et al. | 324/207.25 |
| 7,010,977 B2 * | 3/2006 | Renault | 73/504.13 |
| 7,093,488 B2 * | 8/2006 | Ragot et al. | 73/510 |
| 8,056,413 B2 * | 11/2011 | Yazdi | 73/504.13 |
| 8,210,041 B2 * | 7/2012 | Ragot | 73/504.12 |
| 8,490,485 B2 * | 7/2013 | Vandebeuque et al. | 73/504.13 |
| 8,631,702 B2 * | 1/2014 | Horning et al. | 73/504.13 |
| 8,783,107 B2 * | 7/2014 | Robert et al. | 73/514.29 |
| 2002/0121993 A1 * | 9/2002 | Velazquez | 341/118 |
| 2005/0126289 A1 * | 6/2005 | Ragot et al. | 73/510 |
| 2007/0119258 A1 * | 5/2007 | Yee | 73/649 |
| 2009/0273499 A1 * | 11/2009 | Lang et al. | 341/155 |
| 2010/0207489 A1 * | 8/2010 | Huang | 310/336 |
| 2014/0000365 A1 * | 1/2014 | Aaltonen | 73/504.12 |

\* cited by examiner

METHOD AND DEVICE FOR ANGULAR MEASUREMENT WITH COMPENSATION OF NON-LINEARITIES

COMPENSATION OF NON-LINEARITIES

The present invention relates to a method and a device for angular measurement implementing a resonator which is set into vibration.

Such a device, or vibrating gyroscope, comprises a resonator associated with means for setting into vibration and with means for detecting vibrations. The means of setting into vibration and the means of detection, such as electrostatic transducers, are linked to a processing circuit through which control signals and measurement or detection signals travel.

The precision of the measurement depends on the mastery of the vibrations imparted to the resonator, the response of the resonator to the angular loadings to be measured depending directly on the changes in the vibrations.

The implementation of a vibrating gyroscope therefore requires that the parameters of the vibration be measured so as to monitor the changes therein.

Indeed, the detection signals arising from electrostatic transducers, generally distributed into two or more groups, make it possible to observe the vibration. In the case where the transducers are biased by a high DC voltage, these signals are sinusoidal functions of time whose amplitude and frequency change respectively under the effect of the motions applied to the casing of the gyroscope and of the temperature. The motions to be measured are characterized by passbands of a few hundred Hertz and the thermal fluctuations are filtered by thermal time constants of several seconds. Consequently, the spectrum of the detected signals is concentrated in a frequency band which extends over a few hundred Hertz on either side of the resonant frequency.

With a hemispherical resonator, the signals observed in the base formed by the transducers describe an elliptical trajectory characterized by its major axis of length p and its minor axis of length q according to the following formulae:

$$p \cdot \begin{pmatrix} \cos\theta \\ \sin\theta \end{pmatrix} \cdot \cos\phi + q \cdot \begin{pmatrix} -\sin\theta \\ \cos\theta \end{pmatrix} \cdot \sin\phi$$

$$\dot{\phi} = \omega_0 = 2 \cdot \pi \cdot F_0$$

The angle θ characterizes the orientation of the vibration with respect to the casing of the apparatus and the phase φ is the integral with respect to time of the resonance angular frequency $\omega_0$.

In order to aid the processing thereof, the measurement signals are digitized by an analogue/digital conversion system of the processing circuit. Now, the non-linearities of the conversion system affect the estimate of θ. By way of example, non-linearities of 100 ppm relative to full scale engender errors of the order of 100 μrad in the estimate of θ.

Such errors may be identified in the factory at various operating temperatures. By modelling these errors (tabulation, polynomials) it is then possible to correct the estimate of the electrical angle. At best, this scheme makes it possible to compensate for the initial defect, but it remains powerless faced with changes due for example to the aging of the hardware components.

An aim of the invention is to provide a solution for limiting the effect of the changes in the errors over time.

For this purpose, there is provided, according to the invention, a method of angular measurement by means of a resonator associated with means for setting into vibration and with means for detecting vibrations, which are linked to a processing circuit through which there travel control signals and measurement signals, the method comprising the steps of digitizing the measurement signals and of deducing an angular measurement from the measurement signals, characterized in that the method comprises the steps of:

performing a spectral analysis of the digitized measurement signals so as to detect harmonic distortions therein arising from non-linearity, correcting at least some of the signals travelling through the processing circuit so as to attenuate the non-linearities.

The method of the invention thus utilizes the high spectral purity of the signals arising from the resonator to calibrate the linearity defects of the digitization system during operation. This method utilizes the fact that the non-linearities of the digitization system are revealed by the appearance of spectral lines harmonic of the resonant frequency in the measurement signal. To this end, a compensation table is for example associated with the conversion system so as to linearize the operation thereof, it is then driven in such a way as to cancel the harmonic distortion of the digitized signal.

According to a first embodiment, the correction pertains to the measurement signals.

The method then ensures a correction of the measurement signals.

Advantageously, the correction also pertains to the control signals.

The association of the correction of the control signals with the correction of the measurement signals makes it possible to enhance the effectiveness of the method of the invention.

According to a particularly effective parameterization, during the digitization, the measurement signals are sampled at a high frequency with respect to a resonant frequency of the resonator over a duration of close to the inverse of the resonant frequency and, advantageously, the sampling frequency is at least equal to $(2n+1)F0$ where F0 is the resonant frequency and n the maximum rank of the observable harmonics.

These parameters allow the best detection of the harmonic distortions over the first n harmonics.

Advantageously, the correction is carried out by means of a compensation table adjusted in an iterative manner after a harmonics amplitude estimation and, preferably, the estimation of the amplitudes is performed by the least squares scheme.

This makes it possible to optimize the parameters of the compensation table over time.

According to an advantageous additional characteristic, the means for setting into vibration and for detection comprising electrostatic elements, the method comprises an identification phase which comprises the step of varying a bias voltage of the electrostatic elements by driving the resonator in such a way that the amplitude of the detection signals remains constant at a resonant frequency of the resonator.

This makes it possible to separate the effects of the electronic non-linearities related to the electronic circuit from the effects of the non-linearities related to the detectors themselves. During this step, the amplitude of the vibration varies in inverse relation to the high voltage, thereby causing the non-linearities of the detectors to vary. The current at the resonant frequency being kept constant, the electronic non-linearities are invoked or produced in the same manner during the procedure. This step of the method may be used during the calibration carried out in the factory to identify and compensate for the non-linearities of the detectors. These non-linearities being small and very stable, it will not be necessary to re-peat their identification in the course of the subsequent measurements. Only the non-linearities of the electronics will then need to be corrected during the subsequent implementation of the measurement method.

The subject of the invention is also a device for the implementation of the method hereinabove. This device comprises a resonator associated with electrostatic elements which are linked to a processing circuit through which there travel control signals and measurement signals, the processing circuit comprising an analogue/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

Other characteristics and advantages of the invention will emerge on reading the description which follows of nonlimiting particular modes of implementation of the invention.

Figure 2:
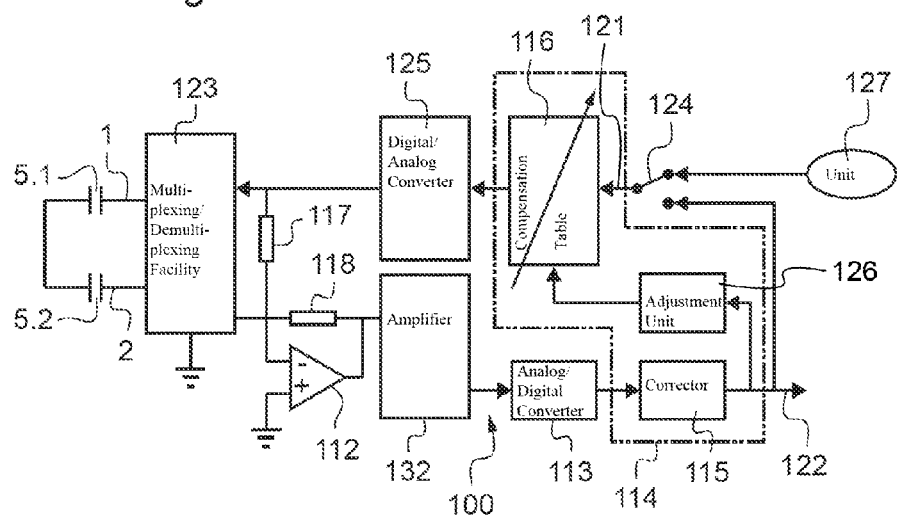

Reference will be made to the appended drawings, among which:

FIG. 1 is a block diagram of a measurement device in accordance with a first embodiment of the invention, FIG. 2 is a view analogous to FIG. 1 of a device in accordance with a second embodiment.

The invention is described here in application to a vibrating gyroscope comprising a hemispherical resonator having an annular edge provided with electrodes and a central foot secured to an electrode-carrying plate provided with electrodes facing the electrodes secured to the annular edge of the hemispherical resonator forming pairs with the said electrodes so as to constitute electrostatic transducers.

The pairs of electrodes are distributed in two groups each linked by a pathway 1 or 2 to a processing circuit.

This structure is known per se and is therefore not detailed here.

In the first mode of implementation of FIG. 1, the pairs of electrodes are used either for detection or for setting into vibration and only the pairs of detection electrodes 5.1, 5.2 and the part, designated generally as 10, of the processing circuit serving for processing the measurement signals emanating from the pairs of detection electrodes 5.1, 5.2 are represented.

The part 10 comprises a time multiplexing member 11 linked at input to the two pathways 1, 2 and at output to an input of a charge amplifier 12 having an output linked to an analogue/digital converter 13 designed to digitize the measurement signals originating from the pairs of detection electrodes 5.1, 5.2. These hardware components are known in themselves.

The multiplexing makes it possible to circumvent the differences in gain between the two pathways which would induce errors of angular estimation.

The analogue/digital converter 13 is linked at output to a processing member 14 designed to implement the method of the invention.

This method comprises the step of performing a spectral analysis of the digitized measurement signals with a view to detecting harmonic distortions therein and the step of correcting the digitized measurement signals by means of a compensation table 15 so as to attenuate the harmonic distortions detected in the digitized measurement signals. These harmonic distortions are representative of non-linearities resulting from the digitization process implemented by the analogue/digital converter 13.

The analogue/digital converter 13 is programmed to sample the measurement signals at a high frequency with respect to a resonant frequency of the resonator over a duration of close to the inverse of the resonant frequency. The sampling frequency is here at least equal to $(2n+1)F0$ where F0 is the resonant frequency and n the maximum rank of the observable harmonics.

The processing member 14 furthermore comprises an adjustment unit 16 designed to adjust the compensation table in an iterative manner after a harmonics amplitude estimation.

Over so short a sampling duration (typically 100 µs), the parameters p, q, θ and ω (see the vibration equations mentioned in the introduction) can generally be considered to be constant with an acceptable level of approximation. Indeed, the changes in p, q and ω which are related to the thermics have a very small dynamic swing. On the speediest carriers such as tactical missiles, it is advantageous to model the angle as an affine function of time, this amounting to approximating the angular rate by a constant over the estimation horizon. A processing for example of least squares type then makes it possible to estimate the amplitude of each of the harmonics. The compensation table is then adjusted in an iterative manner so as to minimize the harmonic distortion.

The digitized and corrected measurement signals are thereafter fed to a calculation unit (not represented) which deduces therefrom an angular measurement.

The method furthermore comprises a prior identification phase, for example carried out in the factory prior to the marketing of the device implementing the method of the invention, which comprises the step of varying a bias voltage of the electrostatic transducers by driving the resonator in such a way that the amplitude of the measurement signals remains constant at the resonant frequency of the resonator.

Indeed, in certain cases, it is advantageous to compensate the electronic and electrostatic non-linearities separately. To separate these two effects, it suffices to vary the bias voltage by driving the resonator so that the amplitude of the current detected at $F_0$ remains constant. In this case, the amplitude of the vibration varies in inverse relation to the high voltage, thereby causing the electrostatic non-linearities to vary. The current at $F_0$ being kept constant, the electronic non-linearities are invoked in the same manner during the procedure. The electrostatic non-linearities can then be corrected once and for all by a calibration step known per se and only the electronic non-linearities will need to be corrected by the compensation provided for in the method of the invention.

In the second mode of implementation represented in FIG. 2, the pairs of electrodes 5.1, 5.2 are linked to a processing circuit designated generally as 100 and are used successively in the guise of actuators for setting into vibration and in the guise of detectors during phases devoted alternately to these uses. This makes it possible to maintain a small mean drift.

The processing circuit 100 comprises a multiplexing/demultiplexing facility 123 linked, on the one hand, to the two pathways 1, 2 and, on the other hand, to an incoming branch 121 and an outgoing branch 122 of the processing circuit 100.

The incoming branch 121 comprises a switch 124 linked to a first input of a processing facility 114 designed to implement the method of the invention. A first output of the processing facility 114 is linked to a digital/analogue converter 125 itself linked to the multiplexing/demultiplexing facility 123.

The outgoing branch 122 comprises a charge amplifier 112 having an input linked to the multiplexing/demultiplexing facility 123 and an output linked to an amplifier with high gain 132 linked to an analogue/digital converter 113. The analogue/digital converter 113 is linked to a second input of the processing facility 114.

The processing facility 114 comprises a corrector 115 C(z) having an input linked to the outgoing branch 112 and an output linked to the angle calculation unit and to a compensation table 116 via an adjustment unit 126 so as to drive the compensation table 116. The compensation table 116 is linked to the incoming branch 121 downstream of the switch 124.

The switch 124 possesses a first state in which it links the incoming branch 121 to a unit 127 for emitting control signals and a second state in which it links the outgoing branch 122, at the output of the corrector 115, to the incoming branch 121.

It will be noted that the charge amplifier 112 is here looped through a resistor 117 linking the incoming branch to the node for connecting the input of the charge amplifier 112 to the outgoing branch, but a capacitor or any other impedance can also be used. The same remark applies to the resistor 118 connected in parallel with the charge amplifier 112 to the outgoing branch.

In the pathway 1 detection phase (switch in its first state), the transducer of pathway 1 is linked to the node for connecting the charge amplifier 112 to the outgoing branch 122 and the transducer of pathway 2 is linked to earth. The current detected on pathway 1 is amplified by the charge amplifier 112 and by the high-gain amplifier 132 before being converted by the analogue/digital converter 113. The digital corrector 115 drives the digital/analogue converter 123 through the compensation table 116 in such a way that the digital/analogue converter 123 then compensates through the resistor 117 the current detected on pathway 1. The gain of the high-gain amplifier 132 reduces the errors related to the analogue/digital converter 113 which then works as a zero detector and the control of the digital/analogue converter 123 is then the image of the detected current. As a first approximation, the detection linearity performance relies on the digital/analogue converter 123 associated with the compensation table 116.

In the pathway 2 detection phase, the roles of the transducers are reversed.

In the pathway 1 control phase (switch in its second state), the transducer of pathway 1 is linked to the output of the digital-analogue converter 123 and the transducer of pathway 2 is linked to earth. The controls formulated by the control signals emission unit are then applied through the assembly consisting of compensation table 116 and digital/analogue converter 123. The control linearity performance then relies on the digital/analogue converter 123 associated with the compensation table 116.

In the pathway 2 control phase, the roles of the transducers are reversed.

In this type of operation, the observations collected during the detection phases are used to compensate the non-linearities of the digital/analogue converter 123 as in the case of the first mode of implementation. The linearity errors of the control chain having been compensated during the detection phases, the controls will therefore be applied without linearity errors.

Of course, the invention is not limited to the modes of implementation described but encompasses any variant entering the field of the invention as defined by the claims.

In particular, although two transducers have been represented in the figures, the invention applies to an arbitrary number of transducers.

The gyroscope can have a different structure from that described, in particular as regards the shape of the resonator.

The correction can pertain to all or some of the measurement signals and/or of the control signals.

What is claimed is:

1. A method of angular measurement by means of a resonator associated with means for setting the resonator into vibration and with means for detecting the vibration, wherein said means are linked to a processing circuit through which there travel control signals and measurement signals, the method comprising the steps of digitizing the measurement signals and of deducing an angular measurement from the measurement signals, characterized in that the method comprises the steps of:
    performing a spectral analysis of the digitized measurement signals so as to detect harmonic distortions therein arising from non-linearities; and
    correcting at least some of the signals travelling through the processing circuit so as to attenuate the non-linearities;
    in which, during the digitization, the measurement signals are sampled at a high frequency with respect to a resonant frequency of the resonator over a duration close to an inverse of the resonant frequency.

2. The method according to claim 1, in which the correction pertains to the measurement signals.

3. The method according to claim 2, in which the correction also pertains to the control signals.

4. An angular measurement device for implementation of the method according to claim 3, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

5. An angular measurement device for implementation of the method according to claim 2, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

6. The method according to claim 1, in which the sampling frequency is at least equal to $(2n+1)F0$ where F0 is the resonant frequency and n is the maximum rank of the observable harmonics.

7. An angular measurement device for implementation of the method according to claim 6, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

8. The method according to claim 1, in which the correction is carried out by means of a compensation table adjusted in an iterative manner after a harmonics amplitude estimation.

9. The method according to claim 8, in which the amplitude estimation is performed by a least squares scheme.

10. An angular measurement device for implementation of the method according to claim 9, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

11. An angular measurement device for implementation of the method according to claim 8, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

12. The method according to claim 1, in which, the means for setting the resonator into vibration and the means for detecting the vibration comprise electrostatic elements, the method comprises an identification phase which comprises the step of varying a bias voltage of the electrostatic elements by driving the resonator in such a way that an amplitude of detection signals remains constant at a resonant frequency of the resonator.

13. An angular measurement device for implementation of the method according to claim 12, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

14. An angular measurement device for implementation of the method according to claim 1, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

15. An angular measurement device for implementation of the method according to claim 1, the device comprising a resonator associated with electrostatic elements which are linked to a processing circuit through which there travel control signals and measurement signals, the processing circuit comprising an analog/digital converter, a charge amplifier, and a processing facility designed to perform a spectral analysis of the measurement signals so as to detect harmonic distortions therein and designed to correct at least some of the signals travelling through the processing circuit by means of a compensation table so as to attenuate the harmonic distortions.

* * * * *